US012743634B2

(12) United States Patent
Nguyen et al.

(10) Patent No.: US 12,743,634 B2
(45) Date of Patent: Sep. 22, 2026

(54) NEURAL NETWORK-BASED DYNAMICAL SYSTEM MODELING FOR CONTRASTIVELY LEARNED CONSERVATION LAWS

(71) Applicants: International Business Machines Corporation, Armonk, NY (US); Massachusetts Institute of Technology, Cambridge, MA (US)

(72) Inventors: Lam Minh Nguyen, Ossining, NY (US); Wang Zhang, Cambridge, MA (US); Subhro Das, Cambridge, MA (US); Alexandre Megretski, Acton, MA (US); Luca Daniel, Cambridge, MA (US)

(73) Assignees: INTERNATIONAL BUSINESS MACHINES CORPORATION, Armonk, NY (US); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 594 days.

(21) Appl. No.: 18/225,050

(22) Filed: Jul. 21, 2023

(65) Prior Publication Data

US 2025/0028973 A1 Jan. 23, 2025

(51) Int. Cl.
*G06F 30/00* (2020.01)
*G06F 30/27* (2020.01)
(Continued)

(52) U.S. Cl.
CPC ............... *G06N 3/10* (2013.01); *G06F 30/27* (2020.01); *G06N 3/04* (2013.01); *G06N 3/08* (2013.01)

(58) Field of Classification Search
CPC ...................................................... G06F 30/27
See application file for complete search history.

(56) References Cited

U.S. PATENT DOCUMENTS 11,501,165 B2 11/2022 Lin
2004/0064426 A1 4/2004 Depold
(Continued)

FOREIGN PATENT DOCUMENTS

CN 115618596 A 1/2023
JP 2022002080 A 1/2022
(Continued)

OTHER PUBLICATIONS

Miles Cranmer et al. Lagrangian Neural Networks. arXiv:2003.04630v2 [cs.LG] Jul. 30, 2020. pp. 9.
(Continued)

*Primary Examiner* — Ajith Jacob
(74) *Attorney, Agent, or Firm* — Amin, Turocy & Watson, LLP

(57) ABSTRACT

Obtain, using at least one hardware processor, data characterizing a physical system governed by a physical conservation law. Apply, using the at least one hardware processor, contrastive learning to the data to automatically capture system invariants of the physical system. Employ, using the at least one hardware processor, a neural projection layer to guarantee that a corresponding dynamic machine learning model preserves the captured system invariants. Optionally, predict performance of the physical system using the corresponding dynamic machine learning model.

20 Claims, 8 Drawing Sheets

(51) Int. Cl.

| | |
|---|---|
| ***G06N 3/04*** | (2023.01) |
| ***G06N 3/08*** | (2023.01) |
| ***G06N 3/10*** | (2006.01) |

(56) References Cited

U.S. PATENT DOCUMENTS

| | | | | |
|---|---|---|---|---|
| 2022/0108151 | A1 | 4/2022 | Ditto | |
| 2022/0414429 | A1 | 12/2022 | Torrado | |
| 2024/0242083 | A1 * | 7/2024 | Wolf | G06N 3/045 |

FOREIGN PATENT DOCUMENTS

| | | | |
|---|---|---|---|
| WO | 2021239795 | A1 | 12/2021 |
| WO | 2023068952 | A1 | 4/2023 |

OTHER PUBLICATIONS

Wang Zhang et al. Concernet: a Contrastive Learning Based Framework for Automated Conservation Law Discovery and Trustworthy Dynamical System Prediction. arXiv:2302.05783v1 [cs.LG] Feb. 11, 2023. pp. 22.

Julen Urain et al. ImitationFlow: Learning Deep Stable Stochastic Dynamic Systems by Normalizing Flows. arXiv:2010.13129v1 [cs.LG] Oct. 25, 2020. pp. 7.

Gaurav Manek et al. Learning Stable Deep Dynamics Models. arXiv:2001.06116v1 [cs.LG] Jan. 17, 2020. pp. 9.

Ziming Liu et al. AI Poincare: Machine Learning Conservation Laws from Trajectories. arXiv:2011.04698v2 [cs.LG] Apr. 26, 2021. pp. 10.

Sam Greydanus et al. Hamiltonian Neural Networks. arXiv:1906.01563, Sep. 5, 2019. pp. 11.

* cited by examiner

| Method | Applicability | Do Not Need Pre-Processing / Prior Knowledge |
|---|---|---|
| Symbolic Reg. | Simple Conservation | × |
| HNN/LNN | Hamiltonians/Lagrangians | ✓ |
| ConCerNet | General Conservation | ✓ |

Table 2. Average $R^2$ with Linear Regression Between the Learned Function and Exact Conservations

| Task | Conservation | $R^2$ |
|---|---|---|
| Ideal Spring Mass System | $x[1]^2 + x[2]^2 = C$ | $0.997 \pm 0.001$ |
| Chemical Kinematics | $x[1] + x[2] = C$ | $0.999998 \pm 1.9e-6$ |
| Kepler System | $\frac{x[3]^2 + x[4]^2}{2} - \frac{1}{\sqrt{x[1]^2 + x[2]^2}} = C_1$ | $0.858 \pm 0.104$ |
| | $x[1]x[4] - x[2]x[3] = C_2$ | $0.994 \pm 0.001$ |
| Heat Equation | $\int U dx = C$ | $0.9995 \pm 0.0003$ |

*FIG. 6A*

Table 3. Simulation Error Over the Tasks

| Task | Mean Square Error | | Violation of Coservation Laws | |
|---|---|---|---|---|
| | Baseline NN | ConCerNet | Baseline NN | ConCerNet |
| Ideal Spring Mass System | 0.022 ± 0.023 | **9.2e-3 ± 5.6e-3** | 0.012 ± 0.032 | **1.4e-4 ± 7.4e-5** |
| Chemical Kinematics | 9.4e-3 ± 5.8e-3 | **5.9e-3 ± 3.7e-3** | 0.019 ± 0.026 | **5.6e-3 ± 5.4e-3** |
| Kepler System | 0.794 ± 0.476 | **0.140 ± 0.067** | 0.016 ± 0.011 | **5.2e-3 ± 4.2e-3** |
| Heat Equation | 7.34e-5 ± 2.62e-5 | **2.79e-5 ± 1.28e-5** | 0.094 ± 0.070 | **0.013 ± 0.008** |

*FIG. 6B*

NEURAL NETWORK-BASED DYNAMICAL SYSTEM MODELING FOR CONTRASTIVELY LEARNED CONSERVATION LAWS

BACKGROUND

The present invention relates generally to the electrical, electronic and computer arts and, more particularly, to machine learning.

Many critical discoveries in the world of physics were driven by distilling the invariants from observations. For instance, the Kepler laws were found by analyzing and fitting parameters for the astronomical observations, and the mass conservation law was first carried out by a series of experiments. However, such discoveries usually require extensive human insights and customized strategies for specific problems.

Recent works on automatic discovery of scientific laws attempt to learn conservation laws from real-world data by proposing symbolic regression. The idea is to recursively fit the data to different combinations of predefined function operators. However, the implicit dependence on human knowledge (i.e. function class and complexity) and high computational cost of these methods limit their application to small physics equations, making them less scalable and incapable of handling general systems with complicated dynamics.

BRIEF SUMMARY

Principles of the invention provide systems and techniques for neural network-based dynamical system modeling for contrastively learning conservation laws. In one aspect, an exemplary method includes the operations of obtaining, using at least one hardware processor, data characterizing a physical system governed by a physical conservation law; applying, using the at least one hardware processor, contrastive learning to the data to automatically capture system invariants of the physical system; and employing, using the at least one hardware processor, a neural projection layer to guarantee that a corresponding dynamic machine learning model preserves the captured system invariants.

In one aspect, a computer program product comprises one or more tangible computer-readable storage media and program instructions stored on at least one of the one or more tangible computer-readable storage media, the program instructions executable by a processor, the program instructions comprising obtaining, using at least one hardware processor, data characterizing a physical system governed by a physical conservation law; applying, using the at least one hardware processor, contrastive learning to the data to automatically capture system invariants of the physical system; and employing, using the at least one hardware processor, a neural projection layer to guarantee that a corresponding dynamic machine learning model preserves the captured system invariants.

In one aspect, an apparatus comprises a memory and at least one processor, coupled to the memory, and operative to perform operations comprising obtaining, using at least one hardware processor, data characterizing a physical system governed by a physical conservation law; applying, using the at least one hardware processor, contrastive learning to the data to automatically capture system invariants of the physical system; and employing, using the at least one hardware processor, a neural projection layer to guarantee that a corresponding dynamic machine learning model preserves the captured system invariants.

As used herein, "facilitating" an action includes performing the action, making the action easier, helping to carry the action out, or causing the action to be performed. Thus, by way of example and not limitation, instructions executing on a processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

- a contrastive learning method that automatically discovers physical conservation laws;
- improves the technological process of machine learning by establishing a learning framework that improves the trustworthiness of deep neural network (DNN)-based dynamics modeling to endow invariant properties;
- a novel contrastive learning perspective of dynamical system trajectory data to capture the corresponding invariants;
- a Square Ratio Loss function suitable for use as a contrastive learning metric;
- a projection layer that imposes conservation of the invariant function for dynamical system trajectory prediction, preserving the conservation quantity during dynamics modeling and guaranteeing that the learned dynamics models preserve the learned invariants;
- a contrastive learning method for automatically capturing system invariants (that is, conservation properties) along the trajectory observations;
- a method that consistently outperforms, by a large margin, baseline neural networks in both coordinate error and conservation metrics;
- with neural network-based parameterization and no dependence on prior knowledge, example embodiments can be extended to complex and large-scale dynamics by leveraging an autoencoder; and
- a coordinate error/conservation violation that is much smaller than baseline neural networks.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 6A and 6B are tables of experimental results, in accordance with example embodiments.

Figure 1A:
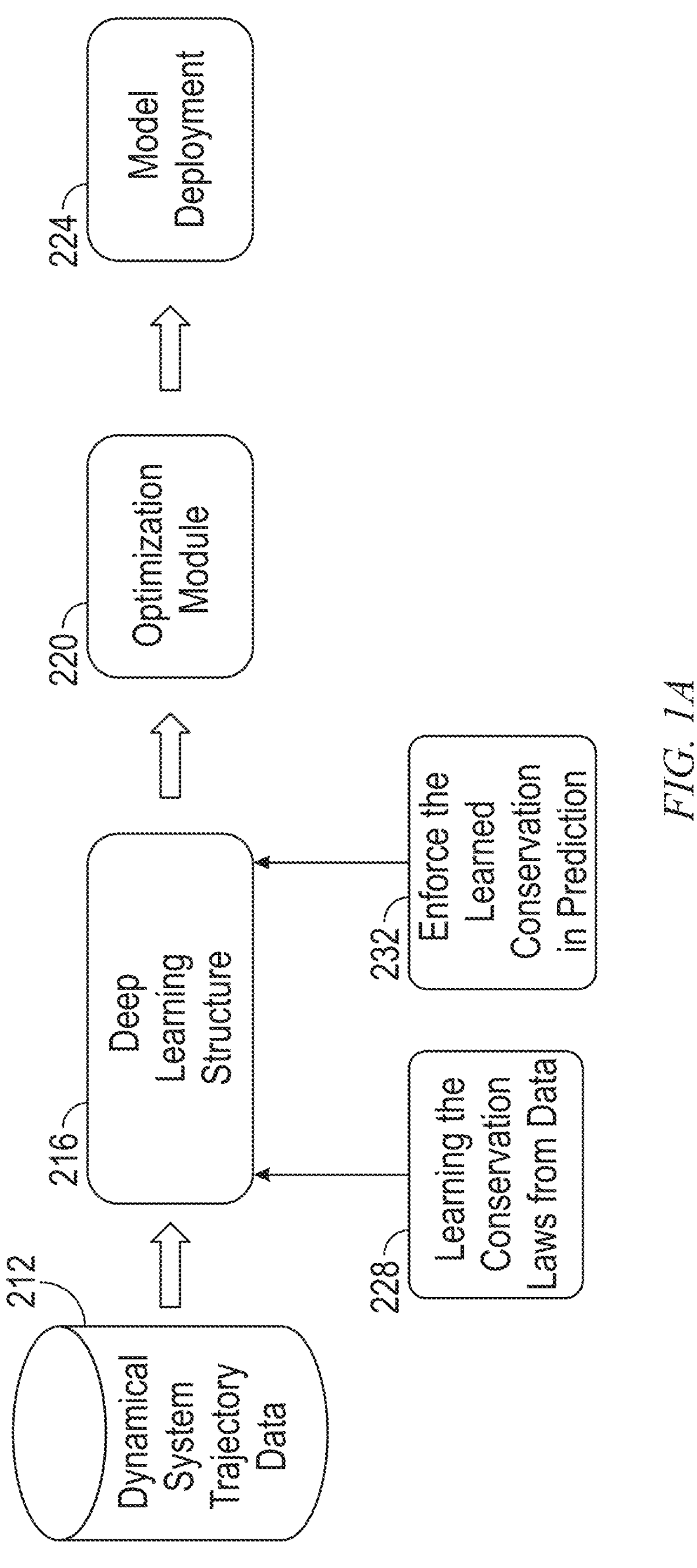
FIG. 1A is a high-level block diagram of a system for learning the system invariants from trajectory data and enforcing it in dynamics prediction, in accordance with an example embodiment.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Deep neural networks (DNNs) have shown great capacity of modeling dynamical systems; nevertheless, they usually do not obey physics constraints, such as conservation laws. One or more embodiments provide a learning framework (referred to as CONtrastive ConsERved Network (ConCerNet) herein) to improve the trustworthiness of DNN-based dynamics modeling to endow the invariant properties. ConCerNet consists of two steps: (i) a contrastive learning method to automatically capture the system invariants (i.e., conservation properties) along the trajectory observations; and (ii) a neural projection layer to guarantee that the learned dynamics models preserve the learned invariants. The functional relationship between the learned latent representation and the unknown system invariant function is theoretically proven. Experiments show that the disclosed method consistently outperforms the baseline neural networks in both coordinate error and conservation metrics by a large margin. With neural network-based parameterization and no dependence on prior knowledge, one or more embodiments can be extended to complex and large-scale dynamics by leveraging an autoencoder.

Introduction

Recent works on automatic discovery of scientific laws attempt to learn conservation laws from real-world data by proposing symbolic regression. The idea is to recursively fit the data to different combinations of predefined function operators. However, the implicit dependence on human knowledge (i.e. function class and complexity) and high computational cost of these methods limit their application to small physics equations, making them less scalable and incapable of handling general systems with complicated dynamics.

On the other hand, the approach of data-driven dynamical modeling tries to learn a dynamical system from data, which often generate models that are prone to violation of physics laws. Thus, it is questionable whether a dynamical system that is trustworthy (that is, obey physics laws) can be learned.

There has been a recent line of work trying to answer this question by actively constructing dynamics models that obey physical constraints. For example, a first conventional technique enforces the Hamiltonian to be conserved in Hamiltonian systems, and a second conventional technique further extends it to Lagrangian dynamics. As these works focus on specific systems, there is yet a method to be designed for preserving the conservation quantities in general dynamical systems.

FIG. 1A is a high-level block diagram of a system for learning the system invariants from trajectory data and enforcing it in dynamics prediction, in accordance with an example embodiment. In one example embodiment, a deep learning structure 216 processes dynamical system trajectory data 212 facilitated by learning the conservation laws from data 228 and enforcement of learned conservation in prediction 232. The results produced by the deep learning structure 216 are optimized by an optimization module 220 and the corresponding model is deployed as part of the model deployment 224. In one example embodiment, conservation laws are learned from real-world data in an automated fashion. In one example embodiment, a pipeline is used to learn trustworthy dynamical systems $f(x)$ based on the automatic discovery of the system's invariants $H(x)$ from data. ConCerNet includes two steps: (i) contrastively learning $H(x)$ as a low-dimensional representation as the invariant quantity for the system; and (ii) learning $f(x)$ to approximate the system dynamics with a correction step. This ensures the learned dynamics automatically preserve the learned $H(x)$.

Figure 1B:
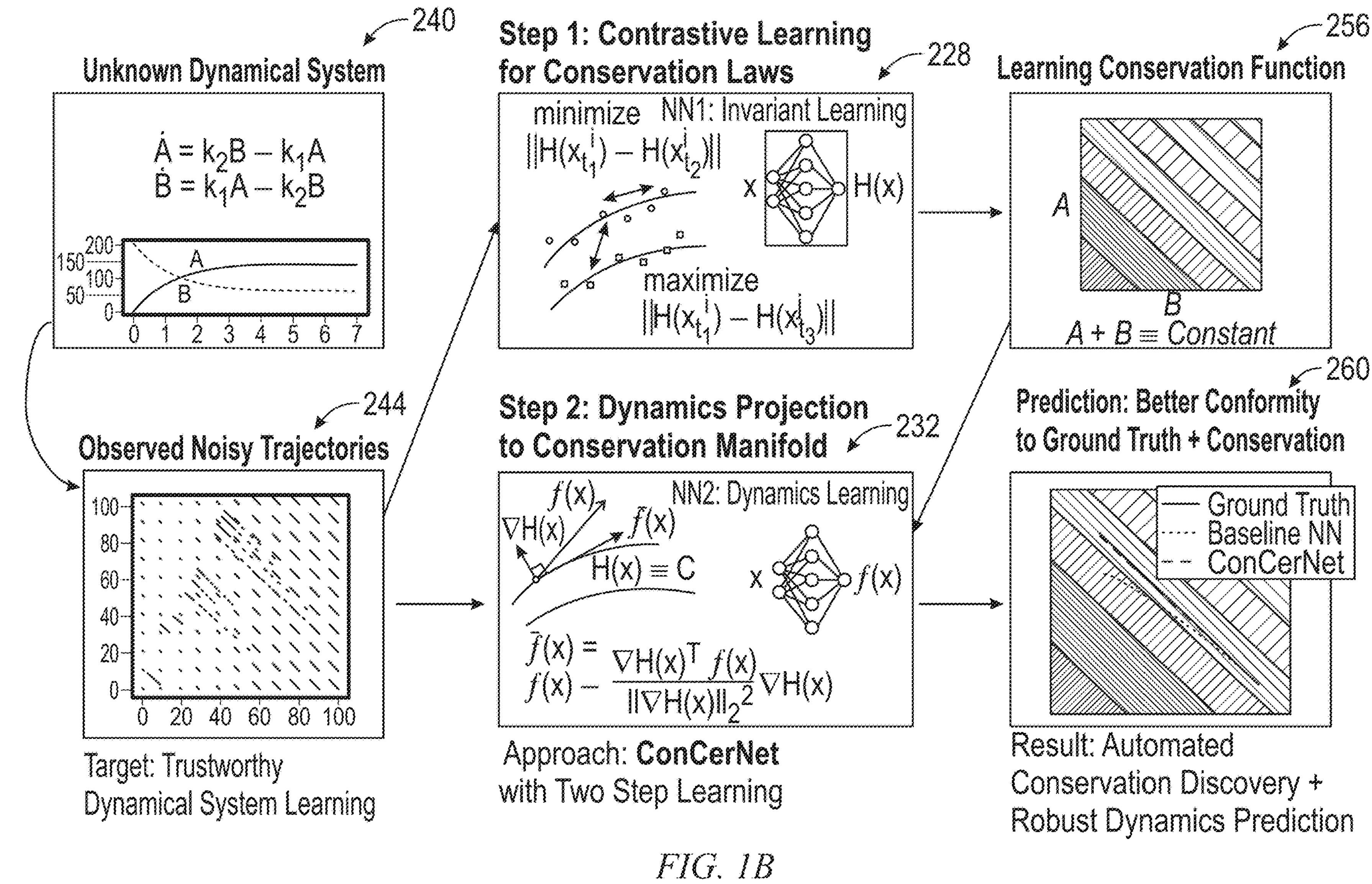
FIG. 1B shows an example pipeline for learning the dynamical system conservation and enforcing it in simulation, in accordance with an example embodiment.

In FIGS. 1A and 1B, element 212 is a data file or other data structure that contains data reflecting the relevant physical characteristics of the system of interest (e.g., robot, elevator) such as position, velocity, and acceleration as a function of time. Deep learning structure 216 can be implemented, for example, using a neural network implemented in software on a general purpose computer or a special purpose computer (e.g., graphical processing unit(s) (GPU(s)), hardware accelerator(s), or the like). Optimization module 220 implements training for the structure 216 on the specific data using known techniques such as forward propagation and back propagation, and can be implemented, e.g., in software in a manner similar to structure 216. Model deployment 224 represents making the trained model available for use in inferencing using known techniques such as making available as a web service, distributing over a network or on a physical storage medium, and the like. Elements 240 and 244 are data file(s) or other data structure(s) that contain data reflecting the relevant physical characteristics of the system of interest (e.g., robot, elevator) such as position, velocity, and acceleration as a function of time. Elements 228 and 232 represent, for example, software that solves the relevant math for Step 1 and Step 2 as described elsewhere herein. Such software can run on a general purpose computer or a special purpose computer (e.g., graphical processing unit(s) (GPU(s)), hardware accelerator(s), or the like). The learned conservation function 256 is the output of block 228 (e.g., neural network with weights) and also an input to block 232, and can be implemented as a data file or other data structure that contains the output data. The further refined model 260 is the output of block 232 (e.g., updated neural network with updated weights), and can be implemented as a data file or other data structure that contains the output data—it enforces the conservation laws and can be used to predict future behavior of the dynamical system.

In one example embodiment, a projection layer imposes conservation of the invariant function for dynamical system trajectory prediction, preserving the conservation quantity during dynamics modeling. One or more embodiments provide a generic learning framework that leverages the above components for dynamical system modeling. It provides robustness in prediction outcomes and flexibility for application in a wide range of dynamical systems that mandate conservation properties.

Under mild conditions, the local minimum property of Square Ratio Loss is proven, theoretically bridging the relationship between the learned latent representation and the original conservation function. Extensive experiments demonstrate the efficacy of ConCerNet. The disclosed contrastive learning method automatically discovers physical conservation laws, and the coordinate error/conservation violation of ConCerNet are much smaller than the baseline neural networks.

BACKGROUND

Contrastive Learning

Unlike discriminative models that explicitly learn the data mappings, contrastive learning aims to extract the data representation implicitly by performing comparisons among examples. The early idea dates back to the 1990s and has been widely adopted in many areas. One related field is metric learning, where the goal is to learn a distance function or latent space to cluster similar examples and separate the dissimilar ones.

Contrastive learning has been a popular choice for self-supervised learning (SSL) tasks recently, as it demonstrated its performance in many applications such as computer vision and natural language processing.

Deep Learning based Dynamical System Modeling

Constructing dynamical system models from observed data is a long-standing research problem with numerous applications such as forecasting, inference and control. System identification (SYSID) was introduced 5-6 decades ago and designed to fit the system input-output behavior with choice of lightweight basis functions. In recent years, neural networks have become increasingly popular in dynamical system modeling due to their representation power. In one example embodiment, the following neural network-based learning task is considered to model an autonomous and continuous time dynamical system:

$$f_\theta(x(t)) \sim \dot{x}(t) \equiv \frac{dx(t)}{dt} \tag{1}$$

where $x \in \mathbb{R}^n$ is the system state and $\dot{x}$ is its time derivative. $f_\theta: \mathbb{R}^n \rightarrow \mathbb{R}^n$ denotes the neural network model $f$ with parameter $\theta$, and $f_\theta$ is used to approximate dynamics evolution.

Conventional neural networks learn the physics through data by minimizing the step prediction error, without a purposely designed feature to honor other metrics such as conservation laws. One path to address this issue is to include an additional loss in the training; however, the soft Lagrangian treatment does not guarantee the model performance during testing. Imposing hard constraints upon the neural network structures is a more desirable approach, where the built-in design naturally respects a certain property regardless of input data. Existing work includes: a first conventional technique that learns the dynamical system and a Lyapunov function to ensure the exponential stability of a predicted system; a second conventional technique (Hamiltonian neural network (HNN) targets at the Hamiltonian mechanics, directly learns the Hamiltonian and uses the symplectic vector field to approximate the dynamics; Lagrangian neural network (LNN)) extends the work of HNN to Lagrangian mechanics. Although the above models are able to capture certain conservation laws under specific problem formulations, they are not applicable to general conserved quantities (such as mass conservation). The disclosed contrastive learning framework is configured in a more generic form that is compatible in working with arbitrary conservation.

Learning with Conserved Properties

Automated scientific discovery from data without prior knowledge has attracted great interest to both communities in physics and machine learning. Besides the above-mentioned HNN and LNN, a few works have explored automated approaches to extract the conservation laws from data. Despite the promising results, the existing methods are mostly based on symbolic regression, and suffer from limitations including poor data sampling efficiency and reliance on prior knowledge and artificial preprocessing. Often, they use search algorithms on pre-defined function classes, and thereby are difficult to extend to larger and more general systems.

Figures 1C, 2:
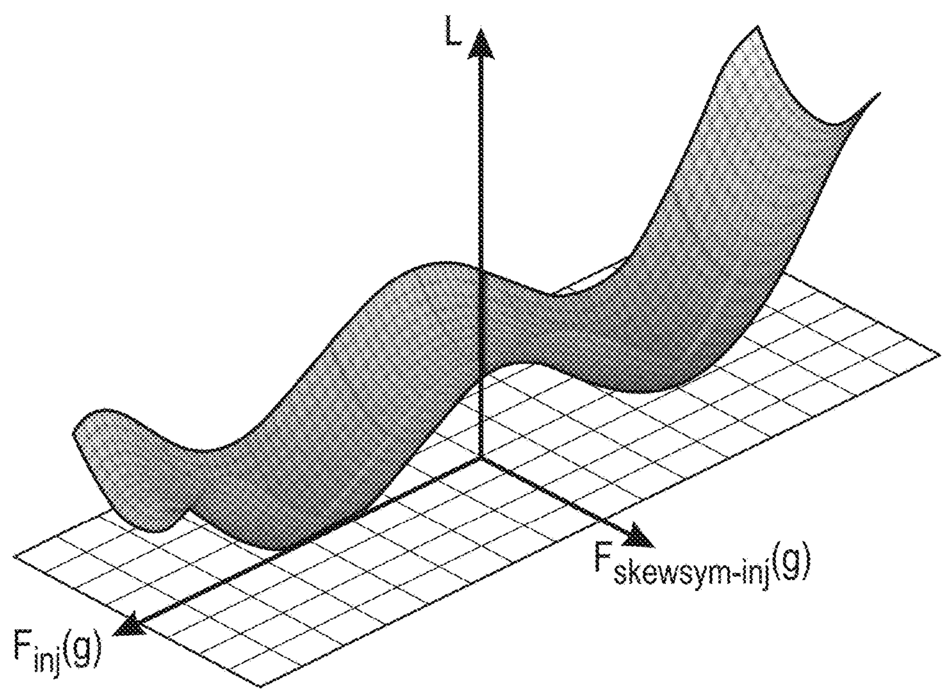
FIG. 1C is a table showing the method applicability comparison of automatic methods to recover conservation laws, in accordance with an example embodiment.
FIG. 2 provides an illustrative example of such a relationship, in accordance with an example embodiment.

FIG. 1C is a table showing the method applicability comparison of automatic methods to recover conservation laws, in accordance with an example embodiment. Automated conservation law discovery was addressed: 1) for a general dynamical system with arbitrary conservation property without any prior knowledge; and 2) through the lens of contrastive learning.

ConCerNet

FIG. 1B shows an example pipeline for learning the dynamical system conservation and enforcing it in simulation, in accordance with an example embodiment. In one example embodiment, an unknown dynamical system 240 is considered. A contrastive learning framework 228 is used to extract the invariants across trajectory observations 244, and then the dynamical model 232 is projected to the invariant manifold to ensure the conservation property. The results are a learned conservation function 256 and an improved prediction 260.

Step 1: Learning Conservation Property from Contrastive Learning

In the practice of dynamical system learning, the dynamics data is usually observed as a set of trajectories of system state $$\{x_t^i \in \mathbb{R}^n\}_{i=1,t=1}^{N,T},$$

where i denotes the trajectory index of total trajectory number N and t is the time step with the number of total time steps T. Let $$\{x_1^i\}_{i=1}^{N}$$

be the initial conditions and assume the initial conditions have different conservation values. Let $H_{\theta_c}: \mathbb{R}^n \rightarrow \mathbb{R}^m$ be the m-dimensional latent mapping function parameterized by the neural network. Following the convention of classical contrastive learning, the system states within the same trajectory are considered "in the same class" and with the same value of conservation properties. Since the invariants are well conserved along the trajectory and differ among different trajectories, an aim is to find the conservation laws that naturally serve as each class's latent representation.

As a metric to persuade similar latent representation within the same trajectory and encourage discrepancy between different trajectories, the Square Ratio Loss (SRL) is introduced, defined in the following as the contrastive loss function:

$$\mathcal{L}_{SR} = \frac{1}{NT}\sum_{i=1}^{N}\sum_{t_1=1}^{T}\left[\frac{\sum_{t_2=1}^{T}\|H_{\theta_c}(x_{t_1}^i) - H_{\theta_c}(x_{t_2}^i)\|^2}{\sum_{j=1}^{N}\sum_{t_2=1}^{T}\|H_{\theta_c}(x_{t_1}^i) - H_{\theta_c}(x_{t_2}^j)\|^2}\right] \tag{2}$$

In each fraction, the denominator summarizes the squared Euclidean norm in the latent space between the anchor point and all other points, and the numerator only summarizes between the anchor point and points within the same trajectory. Therefore, this loss function design is called "square ratio loss." Intuitively, minimizing this loss function will decrease the latent discrepancy between points within the same trajectory and increase the distance between different trajectories.

To note, in common contrastive learning settings, the latent space is usually measured by Cosine distance between point pairs, rather than the Euclidean distance. Besides, the contrastive learning is a classification task while the disclosed metric is a pure value comparison. Further, one point is compared to a group of points in the same class; this is similar to the NaCl loss with many similar points to the anchor point. SRL is chosen as the metric for a few reasons: 1) in contrast with classification objects with discretized sampling distribution space, the dynamical system lives in a continuous space (Euclidean distance comparison intuitively works better); and 2) SRL achieves good experimental performance (as shown in the section entitled "Larger System: Heat Equation"). Through the latter theoretical analysis in Theorem 4.13, the optimization property of SRL that draws the relationship between the learned representation and the exact conservation law can be proven.

Step 2: Enforcing Conservation Invariants in Dynamical Modeling

Once the conservation term $H_{\theta_c}(x) \in \mathbb{R}^m$ is contrastively learned or given from prior knowledge, the predicted trajectory is attempted to be enforced along the conservation manifold in the simulation stage, such that $$\frac{dH_{\theta_c}(x)}{dt} = 0.$$

In the continuous dynamical system like Equation (1), the nominal neural network output $f_{\theta_d}(x)$ can be projected onto the conservation manifold by eliminating its parallel component to the normal direction of the invariant planes (that is, $\nabla_x H_{\theta_c}(x)$). Denoting $G=\nabla_x H_{\theta_c}(x) \in \mathbb{R}^{n\times m}$, the projected dynamical model $\tilde{f}_{\theta_d}(x)$ is defined as follows:

$$\begin{aligned}\tilde{f}_{\theta_d}(x) &:= \text{Projection}\left(f_{\theta_d}(x), \{f: G^\top f = 0\}\right) \\ &= f_{\theta_d}(x) - G(G^\top G)^{-1}G^\top f_{\theta_d}(x) \\ &= f_{\theta_d}(x) - \sum_{i=1}^{m}(G_i^\perp)^\top f_{\theta_d}(x) G_i^\perp\end{aligned}, \tag{3}$$

where the second equality is the standard orthogonal projection equation and the third equality is the Gram-Schmidt process to solve it in practice. Here $G^\perp$ denotes the orthonormalized matrix from G calculated by the Gram-Schmidt process and $$G_i^\perp$$

is the $i^{th}$ component. The projected model dynamics naturally satisfies $(\nabla_x H_{\theta_c}(x))^T \tilde{f}=0$ and therefore guarantees $H_{\theta_c}(x)$ to be constant during prediction. The intuitive diagram of projection with one conservation term (i.e. m=1) is shown in FIG. 1B.

For dynamical system learning, it is assumed that the system time derivative is observable (with noise) for simplicity. The loss function is the mean square loss between the neural network prediction and the system time derivative. For real-world problems with only discretized state observations, the derivative can be approximated by time difference or the continuous system, and discretized data can be bridged by leveraging neural ordinary differential equations (ODE).

$$\mathcal{L}_{dyn} = \mathbb{E}_x\left[\|\tilde{f}_{\theta_d}(x) - \dot{x}\|^2\right]. \tag{4}$$

Theory

The contrastive learning problem from the section entitled "Step 1: Learning Conservation Property from Contrastive Learning" is rigorously formulated below and the latent function property in the case of the SRL loss is described.

Definition 4.1

For function $g(\cdot): X \rightarrow \mathbb{R}^1$ defined on compact set $\mathcal{X} \subset \mathbb{R}^n$, $y \in \mathbb{R}^1$, $\epsilon > 0$, define the preimage $$g_{\mathcal{X}}^{-1}(y, \epsilon) = \{x \mid x \in \mathcal{X}, \|g(x) - y\| \le \epsilon\}.$$

The preimage represents the set of elements in $\mathcal{X}$ mapped to the $\epsilon$ ball centered at y in the image space. $\epsilon$ is called the image neighborhood diameter.

Definition 4.2

For a given implicit $g(\cdot)$ and state set $\mathcal{X}$, define the Continuous Square Ratio Loss (CSRL) as a function of neighborhood diameter $\epsilon$ and target function $h(\cdot): \mathbb{R}^n \rightarrow \mathbb{R}^1$:

$$\mathcal{L}_{CSR}(h(\cdot), \epsilon) = \int_{\mathcal{X}} \frac{\int_{g_{\mathcal{X}}^{-1}(g(x),\epsilon)} (h(x) - h(x'))^2 dx'}{\int_{\mathcal{X}} (h(x) - h(x''))^2 dx''} dx \tag{5}$$

Remark 4.3. To facilitate the notation and problem formulation, the discretized SRL from Equation (2) is converted into the continuous and surrogate version of SRL in Equation (5). To note, they are not equivalent: 1. In the discretized version, the numerator summation set is the points within the same trajectory; it is a "partial preimage" being a subset of the preimage integral area in the continuous loss. In many cases, there is only partial preimage due to observation interval or trajectory length. For the rest of the analysis, the ideal case with access to full preimage is considered. However, a similar analysis can be performed on the partial preimage case and the final functional relationship will be confined to the union of the observed partial preimage. 2. In practice, there exists noise in observation. The continuous version explicitly counts in the factor and summarizes over all the preimage within e diameter to the anchor point. 3. The actual system might have more than one conservation law and one or more exemplary embodiments allow more than one dimension for $H_{\theta_c}(\cdot)$. In this section, only $g(\cdot)$ and $h(\cdot)$ are considered as being one-dimensional. For a system with multiple conservation laws, one conservation term can be selected. In fact, finding the exact conservation function for such systems cannot be guaranteed, as any combination of different conservation functions is conserved as well.

Definition 4.4

Let $\mathcal{F}$ be a functional space of all $\mathbb{R}^n \to \mathbb{R}^1$ functions defined on a compact set $\mathcal{X} \subset \mathbb{R}^n$.

For function $f_1(\cdot)$, $f_2(\cdot) \in \mathcal{F}$, it is denoted that $f_2(\cdot)$ is "functional injective" to $f_1(\cdot)$ if $\forall_{x_1,x_2} \in \mathcal{X}$, $f_1(x_1)=f_1(x_2) \Rightarrow f_2(x_1)=f_2(x_2)$.

Denote $\mathcal{F}_{inj}(f_1)$ as "functional injective set" to $f_1(\cdot)$, if it is the set of all the functions in $\mathcal{F}$ being functional injective to $f_1(\cdot)$.

For function $f_1(\cdot)$, $f_2(\cdot) \in \mathcal{F}$, $f_2(\cdot)$ is denoted as "skew-symmetric functional injective" to $f_1(\cdot)$, if $\forall_r \in \mathbb{R}$, $\int_{\Omega(r,f_1(\cdot))} f_2(x)dx=0$, where $\Omega(r, f_1(\cdot)=\{x|f_1(x)=r, x \in \mathcal{X}\}$ denotes the preimage of function $f_1(\cdot)$ mapped to r.

Denote $\mathcal{F}_{skewsym\text{-}inj}(f_1)$ as "skew-symmetric functional injective set" to $f_1(\cdot)$, if it is the set of all the functions in $\mathcal{F}$ being skew-symmetric functional injective to $f_1(\cdot)$.

Remark 4.5. $f_2(\cdot)$ being "functional injective" to $f_1(\cdot)$ is equivalent to say that there exists another function $f_3(\cdot)$, $f_2(\cdot)$ that can be written as a composition of $f_3(\cdot)$ and $f_1(\cdot)$ such that $f_2(x)=f_3(f_1(x))$.

Proposition 4.6

Let $\mathbb{R}$ denote the set of real numbers. $\mathcal{F}$ is a vector space over field $\mathbb{R}$. For $f_1(\cdot) \in \mathcal{F}$, $\mathcal{F}_{inj}(f_1)$ and $\mathcal{F}_{skewsym\text{-}inj}(f_1)$ are complemented subspaces of $\mathcal{F}$.

Definition 4.7

Let $\mathcal{F}$ be a functional space. $\mathcal{L}(f(\cdot)): \mathcal{F} \to \mathbb{R}^1$ is a composition of function $f(\cdot) \in \mathcal{F}$. Let $\mathcal{F}_1$ and $\mathcal{F}_2$ be complemented subspaces of $\mathcal{F}$. $\mathcal{L}$ is said to reach a "directional local minimum" for any perturbation along $\mathcal{F}_2$ on $f_1(\cdot) \in \mathcal{F}_1$, if $\exists \delta>0$, $\forall f_2 \in \mathcal{F}_2$, $\mathcal{L}(f_1(\cdot)+\delta f_2(\cdot)) > \mathcal{L}(f_1(\cdot))$.

Definition 4.8

For function $f_1(\cdot)$ and $f_2(\cdot)$ defined on some compact set $\mathcal{X}$, $f_2(\cdot)$ is denoted as "relative Lipschiz continuous" to $f_1(\cdot)$ if $\forall x_1, x_2 \in \mathcal{X}$, $\|f_2(x_1)-f_2(x_2)\|<C\|f_1(x_1)-f_1(x_2)\|$ for some constant C.

Assumption 4.9

$h(\cdot)$ is $C_1$ relative Lipschiz continuous to $g(\cdot)$ and $g(\cdot)$ is $$C_1'$$

relative Lipschiz continuous to $h(\cdot)$.

Condition 4.10

$\epsilon$ is small enough such that for $\forall x \in X$, $$\epsilon < \sqrt{\frac{\int_{\mathcal{X}} (h(x) - h(x''))^2 dx''}{\int_{\mathcal{X}} 1 dx''}} / (C_1 \sqrt{5C_2})$$

where $C_1$ is the Lipschitz continuous constant defined in Assumption 4.9 and $$C_2 = \max_{x_1,x_2} \frac{\int_{\mathcal{X}} (h(x_1) - h(x''))^2 dx''}{\int_{\mathcal{X}} (h(x_2) - h(x''))^2 dx''}$$

is the maximum generalized variance ratio of $h(\cdot)$ on $\mathcal{X}$.

Condition 4.11

$\epsilon$ is small enough such that for $\forall x \in X$, $$C_1 \epsilon \frac{\int_{x' \in g_{\mathcal{X}}^{-1}(g(x),\epsilon)} (h(x) - h(x'))dx'}{\int_{x' \in g_{\mathcal{X}}^{-1}(g(x),\epsilon)} (h(x) - h(x'))^2 dx'} < \int_{x \in \mathcal{X}} 1 dx$$

Remark 4.12. In the following Theorem 4.13, the case $h(\cdot)$ being "functional injective" to $g(\cdot)$, when $h(\cdot)$ varies along with $g(\cdot)$, is described below. Assumption 4.9 caps the variation magnitude between $h(\cdot)$ and $g(\cdot)$. Condition 4.10 requires the neighborhood diameter $\epsilon$ to be smaller than some constant. Condition 4.11 is introduced to facilitate the proof process, which is justified by claiming the left-hand side converges to 0 when $\epsilon \to 0$, so a small and finite e can always be found to satisfy the conditions.

Theorem 4.13

For system state $x \in \mathbb{R}^n$ uniformly distributed on a compact set $\mathcal{X} \subset \mathbb{R}^n$, consider an unknown non-constant smooth mapping function $g(\cdot): \mathbb{R}^n \to \mathbb{R}^1$ and known corresponding preimage operator $$g_{\mathcal{X}}^{-1}(\cdot, \epsilon)$$

(defined in Definition 4.1) with diameter $\epsilon>0$. Let F be a functional space of all $\mathbb{R}^n \to \mathbb{R}^1$ functions defined on $\mathcal{X}$. Consider the continuous square ratio loss $\mathcal{L}$ from Definition 4.2 and optimize it over $h(\cdot) \in F$. Suppose the optimizer finds $h(\cdot) \in F_{inj}(g)$ satisfying Assumption 4.9 and $\epsilon$ satisfies Condition 4.10 and 4.11, then $\mathcal{L}$ reaches a directional local minimum (defined in Definition 4.7) for any perturbation from $F_{skewsym\text{-}inj}(g)$ (defined in Definition 4.4).

Remark 4.14. Considering that $h(\cdot)$ is parameterized on the functional space $\mathcal{F}$ and recalling the definition of "directional local minimum" from Definition 4.7, Theorem 4.13 claims if the optimization finds $h(\cdot) \in \mathcal{F}_{inj}(g)$ and it satisfies the mentioned conditions, then any perturbation from $\mathcal{F}_{skewsym\text{-}inj}(g)$ results in the increase of the loss function. FIG. 2 provides an illustrative example of such a relationship, in accordance with an example embodiment. (The curve running the length of the graph visualization denotes $h(\cdot) \in \mathcal{F}_{inj}(g)$, the curves running across the width of the graph visualization denote the perturbations in $\mathcal{F}_{skewsym-inj}$(g).) In practice, once the gradient descent optimizer finds a function injective h(•) to g(•), the optimizer will stay inside $\mathcal{F}_{inj}$(g), as the gradient descent method reaches a local minimum point for any perturbation step along $\mathcal{F}_{skewsym-inj}$(g).

As a major theoretical result, Theorem 4.13 narrates that, through the disclosed method, without knowing the exact invariant mapping function of the physics systems, the neural network is capable to recover it from the state neighborhood relationship in the image space. Although the framework is used for dynamical system trajectory observations, the insight can be further extended to other physics or non-physics systems with inherent invariant properties.

Experiments

Two simple conservation examples are used to illustrate the ConCerNet procedures, and the model performance for a system with multiple conservation laws is described. In the end, the power of exemplary embodiments is demonstrated and the ConCerNet pipeline is extended to high-dimensional problems by leveraging an autoencoder. As one task focuses on improving dynamical simulation trustworthiness on conservation properties, the conservation learning experiments are recorded in Table 2 of FIG. 6A and the dynamical model performance is recorded in Table 3 of FIG. 6B. ConCerNet is also compared with prior work on two Hamiltonian systems (we found that ConCerNet shows similar performance but ConCerNet is more generally applicable. All the experiments are performed over five random seeds).

Simple Conservation Examples

Figure 3:
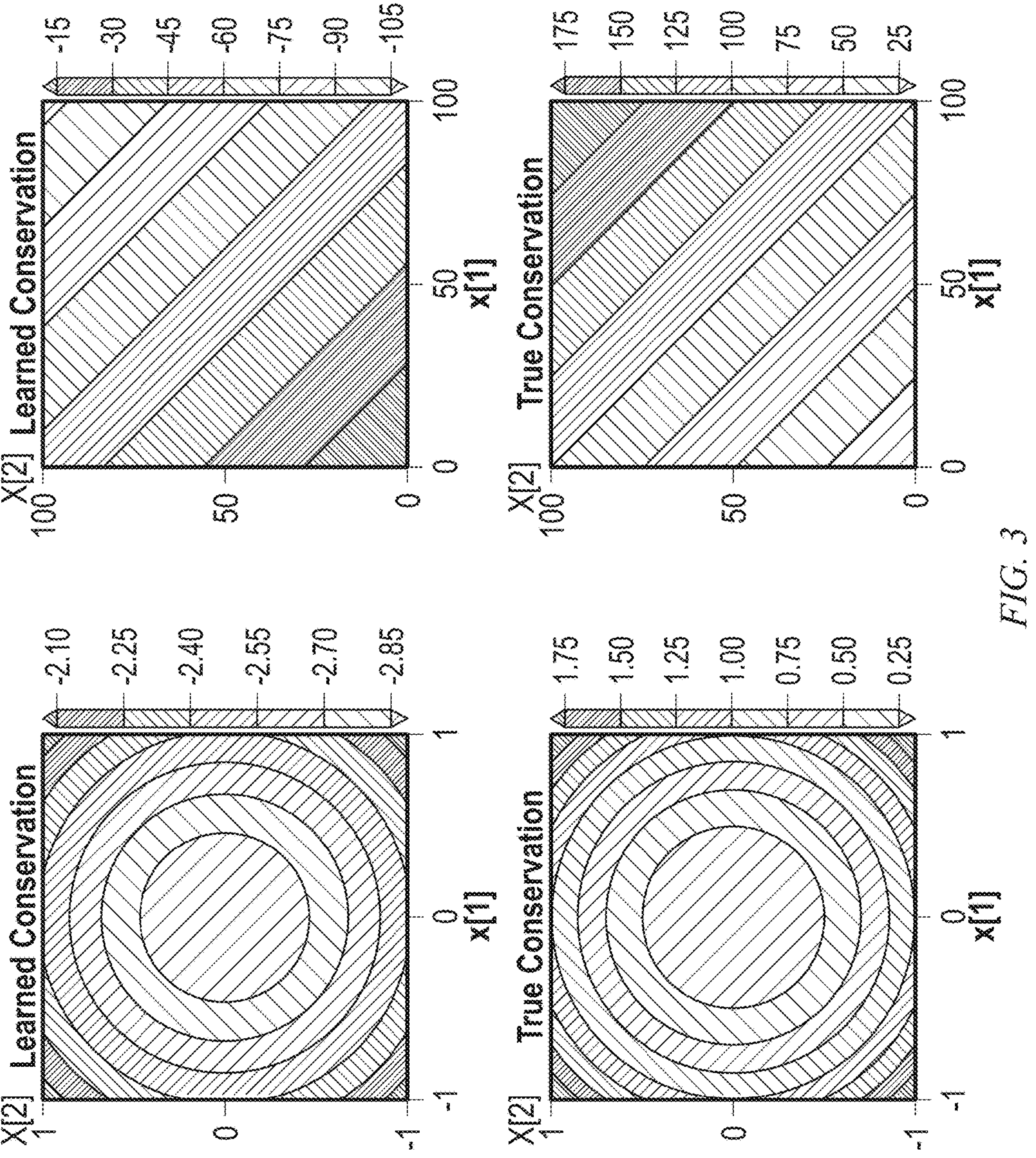
FIG. 3 shows the learned conservation compared with ground truth, in accordance with example embodiments.
Figure 4:
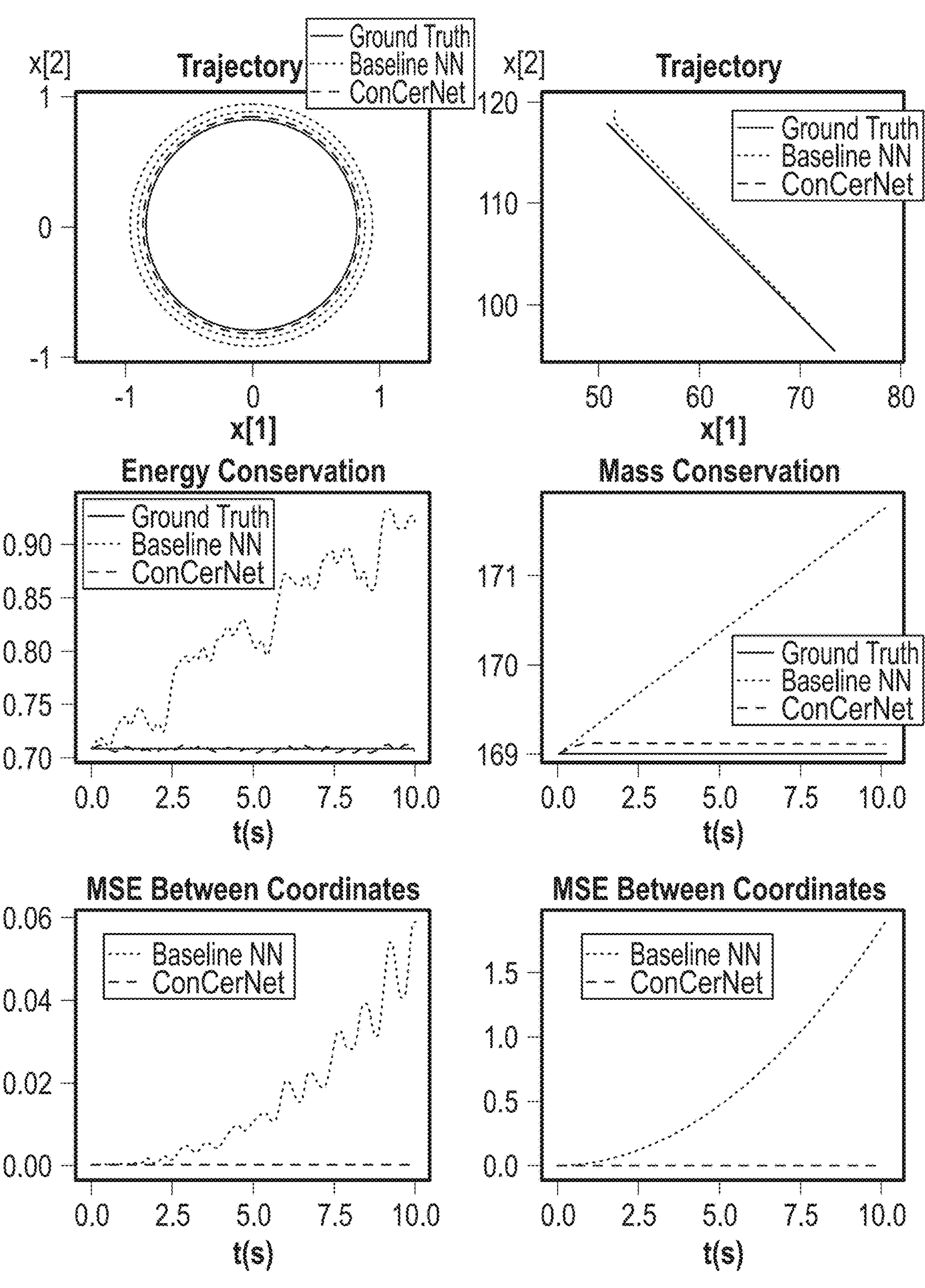
FIG. 4 shows the results of comparing two methods by showing the typical trajectory, conservation violation and coordinate error to the ground truth, in accordance with an example embodiment.

As described below, two simple examples are presented: ideal spring mass system under energy conservation ($x[1]^2+x[2]^2$) and chemical reaction under mass conservation ($x[1]+x[2]$). Both systems have two-dimensional (2D) state space for easier visualization of the learned conservation function. FIG. 3 shows the learned conservation compared with ground truth, in accordance with example embodiments. (FIG. 3, left-side: ideal spring mass; right-side: chemical kinetics.) The contrastive learning process captures the quadratic and linear functions, as the contour lines are drawn in circles and lines. To note, the learned conservation function here is approximately the exact conservation function differing by some constant coefficient (their relationship is further discussed in the section entitled "Learned invariants vs exact conservation laws"). This is a natural result because the SRL is invariant to linear transform of $H_{\theta_c}(\bullet)$; furthermore, the real-world conservation quantity is also a relative value instead of an absolute value. FIG. 4 shows the results of comparing two methods by showing the typical trajectory, conservation violation and coordinate error to the ground truth, in accordance with an example embodiment. (FIG. 4: upper row: ideal spring mass system; lower row: chemical kinematics; first column: state trajectories; second column: violation of conservation laws to ground truth; third column: mean square error to ground truth.) The conventional neural network is likely to quickly diverge from the conserved trajectory, and the error grows faster than with the disclosed method.

Systems with More than One Conservation Function

A more complex system with more than one conservation law is described below. The Kepler system describes a planet orbiting around a star with elliptical trajectories.

The planet's state is four-dimensional, including both coordinates in the 2D plane and the corresponding velocity. The system has two conservation terms: energy conservation $$g_1(x) = \frac{x[3]^2 + x[4]^2}{2} - \frac{1}{\sqrt{x[1]^2 + x[2]^2}}$$

and angular momentum conservation $g_2(x)=x[1]x[4]-x[2]x[3]$.

In the description above (Remark 4.3), it is claimed that, if the system has more than one conservation property, one or more embodiments do not guarantee to find the injective function of each individual conservation equation. Consider the Kepler example: any functional combination of $g_1(x)$ and $g_2(x)$ is also conserved. In practice, it was found that the learned function is likely to converge to some linear function of the simpler conservation function. As functions with a four-dimension input cannot be visualized, 10 trajectories are randomly sampled and $R^2$ is calculated by linear regressing the learned function towards each conservation function. The results in Table 2 of FIG. 6A indicate that the learned function correlates with the angular momentum equation better than the energy equation which is more difficult to represent by the neural network. The latent neural network is also tested with two-dimensional output (m=2): the two outputs are likely to be linear to each other, which does not affect dynamical prediction or the square ratio loss. Despite not learning all the conservation laws, in the simulation stage, the disclosed method still outperforms the conventional neural network by a large margin in both metrics with the learned invariant, as the results show in Table 3 of FIG. 6B.

Larger System: Heat Equation

To further extend one or more embodiments to larger systems, an exemplary embodiments was tested on solving the Heat Equation on a one-dimensional (1D) rod. The 1D rod is given some initial temperature distribution and insulated boundary conditions on both ends. The temperature U(y, t), as a function of coordinate and time, gradually evens up following the heat equation $$\frac{\partial U}{\partial t} = \frac{\partial^2 U}{\partial y^2}.$$

The total internal energy along the rod does not vary because the heat flow is blocked by the boundary. System state x is used consisting of overall 101 nodes to discretize $y \in [-5, 5]$ and compress system states to a nine-dimension latent space with an autoencoder pair $(E_{\theta_E}, D_{\theta_D})$. For both contrastive conservation learning and dynamical system learning, original space state and time derivative $(x, \dot{x})$ are mapped to the autoencoder latent space $(z, \dot{z})$ by $$z = E_{\theta_E}(x),\ \dot{z} = \frac{\partial E_{\theta_E}(x)}{\partial x} \times \dot{x}, \tag{6}$$

where × denotes the matrix multiplication by chain rule, the partial derivative from latent space to original space can be calculated by an auto-differentiation package. After simulation, in one or more embodiments, the latent space trajectory is mapped back to the original space by $D_{\theta_D}$.

Figure 5:
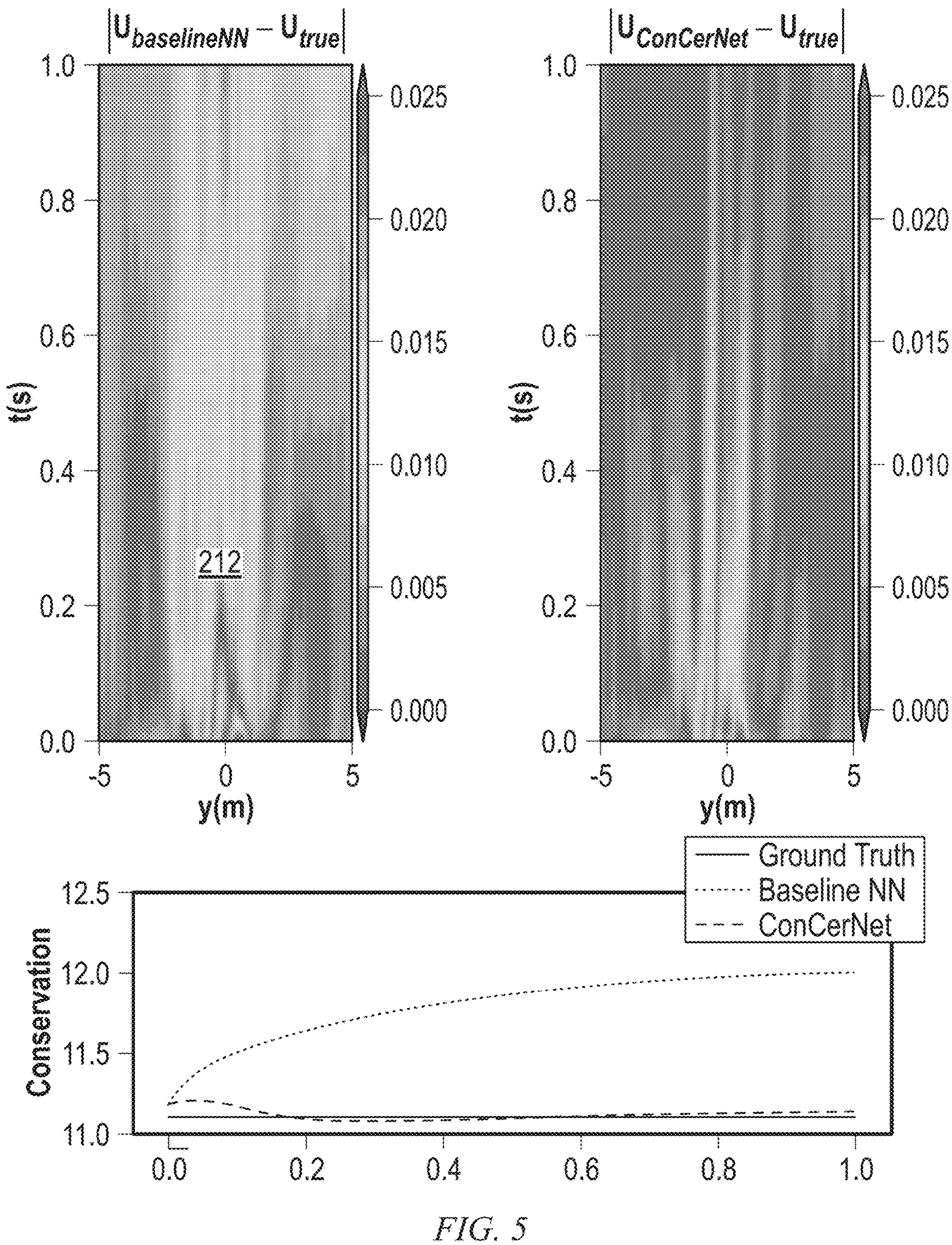
FIG. 5 draws the simulation result and a conservation metric comparison between the conventional neural network and the disclosed method for a heat equation simulation, in accordance with an example embodiment.

Table 2 of FIG. 6A shows that the neural network is capable of capturing an affine function of mass conservation, regardless of the reduced order and non-linear representation space. FIG. 5 draws the simulation result and a conservation metric comparison between the conventional neural network and the disclosed method for a heat equation simulation, in accordance with an example embodiment. (FIG. 5: upper plots: simulation coordinate error comparison: conventional neural network and ConCerNet; bottom graph: conservation violation to ground truth.) For both methods, the initial conservation violation error was introduced by the autoencoder. In general, the disclosed method conforms to ground truth trajectory and conservation laws much better than the conventional method.

Experiment Summary

The quantitative results are generalized for all the above experiments in Table 2 and Table 3 of FIGS. 6A and 6B. For conservation learning testing, 10 trajectories were randomly sampled and the learned conservation function was linear regressed into each of the exact conservation laws and the $R^2$ values were reported. To test dynamics modeling, 10 initial points were sampled and the simulated trajectory was integrated with the Runge-Kutta method, and the trajectory state coordinate error and conservation violation to the ground truth were calculated. The disclosed method outperforms the baseline neural networks as the error is often multiple times smaller. One may notice that the standard deviation is comparable with the error metric in the dynamics experiments; this is due to the instability of the dynamical systems. The trajectory tracking error will exponentially grow as a function of time, and the cases with outlier initialization are likely to dominate the averaged results and lead to large variance. In practice, one or more embodiments can advantageously control the tracking deviation better than the baseline method across almost all the cases.

Learned Invariants Vs Exact Conservation Laws

From the theoretical side, for systems with only one conservation law, it is proven through Theorem 4.13 that the optimizer converges to a composition function of the conservation function g(•). For systems with more than one conservation law, it is difficult for the system to retrieve even one of the conservation equations, as any combination of individual conservation functions is also conserved, and Theorem 4.13 only guarantees the convergence to one of these combinations. Some prior work claiming to find the exact conservation functions depends on the prior human knowledge of conservation functions (that is, using symbolic regression or limiting the fitting function classes). However, one or more embodiments advantageously take a generic route using neural network parameterization to represent general functions, and therefore it can be extended to more complex systems or even non-linear representations (like the heat equation case). Therefore, symbolic regression-based work in conservation learning comparisons is not considered as they are dependent on application-specific knowledge.

In practice, it was found that h(•) is likely to be a linear function of g(•); as Table 2 of FIG. 6A shows the $R_2$ coefficients under linear regression, the linear relationship can be determined from the contours in FIG. 3.

An intuitive explanation for the interesting experimental finding on the linear relationship is that the linear function is relatively easy for the neural network to express. It is noted that a focus was on improving the conservation performance for dynamical modeling. Regardless of the mapping between the learned function and the exact conservation function, the simulation is guaranteed to preserve the conservation property if the mapping is injective.

ConCerNet Robustness to Noisy Observation and Contrastive Learning Data Efficiency To test the overall ConCerNet method performance under noisy observations, experiments were performed with different noise settings and the simulation error was compared. In general, ConCerNet is much less vulnerable to observation noise compared with baseline neural networks, as the projection layer provides a robust guarantee that the system will not deviate far away from the conservation manifold.

The contrastive conservation learning data efficiency was also tested; experiments were conducted with different observed trajectory numbers and points per trajectory, and the $R^2$ coefficient between the learned function and exact conservation law was recorded. In general, 100 to 1000 points were usually needed to reach $R^2 \approx 1$ for the above four examples; the contrastive conservation learning is relatively data efficient.

Given the discussion thus far, it will be appreciated that, in general terms, an exemplary method, according to an aspect of the invention, includes the operations of obtaining, using at least one hardware processor, data 212 characterizing a physical system governed by a physical conservation law; applying, using the at least one hardware processor, contrastive learning to the data to automatically capture system invariants of the physical system as per 228; and employing, using the at least one hardware processor, a neural projection layer to guarantee that a corresponding dynamic machine learning model (e.g., neural network/deep learning) preserves the captured system invariants, as per 232.

It is worth noting that a baseline method uses a neural network modeled function $f_{\theta_d}$ to do training/testing. With one or more embodiments, after contrastively learned $H_{\theta_c}$, place $f_{\theta d}$ with $f_{\theta d}$ by the projection method (equation (3)), for all the training/testing process. The new model $\tilde{f}_{\theta_d}$ includes the original neural network $f_{\theta d}$ and $H_{\theta_c}$, its output $\tilde{f}_{\theta d}$ is governed by equation (3). This method is used in one or more embodiments for forecasting dynamical systems (e.g. predicting robot future trajectory given current system state and control signal, but one or more embodiments are not used to generate control signals per se). One or more embodiments accordingly improve the technological process of modeling dynamic systems by providing machine learning models of the behavior of such systems that are more accurate than those of the prior art. Further, these improved machine learning models can be employed as design tools and can be used to update a design. For example, if the forecast dynamical system result such as robot future trajectory for a given system state and control signal is not acceptable, the control signal and/or the electromechanical design of the robot could be updated by a human engineer based on the forecast to achieve a desired result. The revised system (i.e., with updated control signals and/or updated electromechanical design) can then be modeled using aspects of the invention to verify proper performance. The proper performance of the updated design could be verified by physical experiments and the updated design could be deployed.

One or more embodiments further include designing, using the at least one hardware processor, a square ratio loss function as a contrastive learning metric, wherein the captured system invariants are contrastively learned as a low-dimensional representation as an invariant quantity for the physical system and wherein the employing operation projects the corresponding dynamic model to an invariant manifold to ensure a conservation property.

In one or more embodiments, the employing operation imposes conservation of an invariant function for dynamical system trajectory prediction, preserving a conservation quantity during dynamics modeling.

Further regarding the square ratio loss function, in one or more embodiments the same is defined as a contrastive loss function:

$$\mathcal{L}_{SR} = \frac{1}{NT}\Sigma_{i=1}^{N}\Sigma_{t_1=1}^{T}\left[\frac{\Sigma_{t_2=1}^{T}\left\|H_{\theta_c}(x_{t_1}^{i}) - H_{\theta_c}(x_{t_2}^{i})\right\|^2}{\Sigma_{j=1}^{N}\Sigma_{t_2=1}^{T}\left\|H_{\theta_c}(x_{t_1}^{i}) - H_{\theta_c}(x_{t_2}^{j})\right\|^2}\right]$$

where $H_{\theta_c}(x)$ is a conservation term.

The conservation term $H_{\theta_c}(x) \in \mathbb{R}^m$ Can, for example, be contrastively learned or given from prior knowledge, and a predicted trajectory can be attempted to be enforced along a conservation manifold in a simulation stage such that $$\frac{dH_{\theta_c}(x)}{dt} = 0$$

and, denoting $G = \nabla_x H_{\theta_c}(x) \in \mathbb{R}^{n \times m}$, a projected dynamical model $\tilde{f}_{\theta_d}(x)$ can be defined as follows:

$$\tilde{f}_{\theta_d}(x) := \text{Projection}\left(f_{\theta_d}(x),\ \{f : G^\top f = 0\}\right) =$$
$$f_{\theta_d}(x) - G(G^\top G)^{-1}G^\top f_{\theta_d}(x) = f_{\theta_d}(x) - \Sigma_{i=1}^{m}(G_i^{\perp})^\top f_{\theta_d}(x)G_i^{\perp}.$$

The second equality is a standard orthogonal projection equation and the third equality is a Gram-Schmidt process. Note that $G^{\perp}$ denotes an orthonormalized matrix from G calculated by the Gram-Schmidt process, wherein $$G_i^{\perp}$$

is an $i^{th}$ component, and wherein the projected model dynamics naturally satisfies $(\nabla_x H_{\theta_c}(x))^{\perp}\tilde{f}=0$ and guarantees that $H_{\theta_c}(x)$ is constant during prediction.

One or more embodiments further include predicting performance of the physical system using the corresponding dynamic machine learning model. Optionally, in such cases, one or more embodiments further include, responsive to the predicting of the performance indicating unsatisfactory performance, redesigning the physical system; repeating the obtaining, applying, and employing steps for the redesigned physical system to obtain an updated dynamic machine learning model; predicting performance of the redesigned physical system using the updated dynamic machine learning model; and, responsive to the predicting of the performance of the redesigned indicating satisfactory performance, deploying and using the redesigned physical system. Refer, for example, to the above discussion re redesigning and/or changing the control signals for a robot.

In another aspect, a computer program product includes one or more tangible computer-readable storage media and program instructions stored on at least one of the one or more tangible computer-readable storage media, the program instructions executable by a processor to cause the processor to carry out or otherwise facilitate any one, some, or all of the method steps disclosed herein.

In still another aspect, an apparatus includes a memory and at least one processor, coupled to the memory, and operative to carry out or otherwise facilitate any one, some, or all of the method steps disclosed herein. See, e.g., the discussion of FIG. 7 below.

Figure 7:
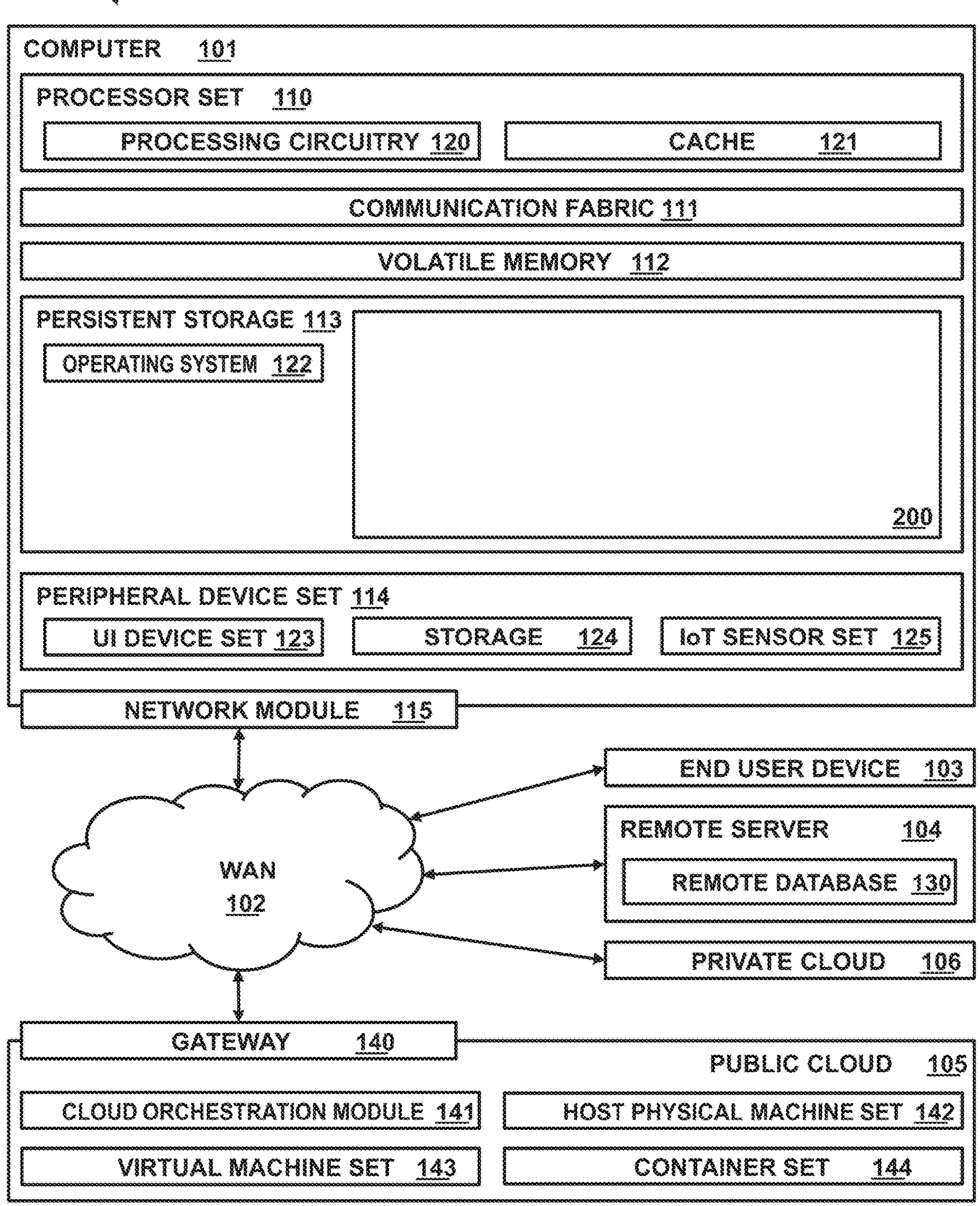
FIG. 7 depicts a computing environment according to an embodiment of the present invention.

Refer now to FIG. 7.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as code 200 implementing neural network-based dynamical system modeling for contrastively learned conservation laws in accordance with aspects of the invention (as noted, aspects of the invention can be employed as a design tool that can facilitate redesign of a system by a human engineer, for example, via interactions over WAN 102). In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT)

sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:

obtaining, using at least one hardware processor, data characterizing a physical system governed by a physical conservation law;

applying, using the at least one hardware processor, contrastive learning to the data to automatically capture system invariants of the physical system; and employing, using the at least one hardware processor, a neural projection layer to guarantee that a corresponding dynamic machine learning model preserves the captured system invariants, wherein a conservation term $H\theta c(x)$ is contrastively learned or given from prior knowledge, and wherein a predicted trajectory is constrained during a simulation stage to remain on a conservation manifold associated with the conservation term by applying an orthogonal projection operation that removes components of predicted dynamics parallel to a normal direction of the conservation manifold, such that projected model dynamics preserve the conservation term during prediction.

2. The method of claim 1, further comprising designing, using the at least one hardware processor, a square ratio loss function as a contrastive learning metric, wherein the captured system invariants are contrastively learned as a low-dimensional representation as an invariant quantity for the physical system and wherein the employing operation projects the corresponding dynamic model to an invariant manifold to ensure a conservation property.

3. The method of claim 2, wherein the employing operation imposes conservation of an invariant function for dynamical system trajectory prediction, preserving a conservation quantity during dynamics modeling.

4. The method of claim 2, wherein the square ratio loss function is defined as a contrastive loss function:

$$\mathcal{L}_{SR} = \frac{1}{NT}\Sigma_{i=1}^{N}\Sigma_{t_1=1}^{T}\left[\frac{\Sigma_{t_2=1}^{T}\|H_{\theta_c}(x_{t_1}^i) - H_{\theta_c}(x_{t_2}^i)\|^2}{\Sigma_{j=1}^{N}\Sigma_{t_2=1}^{T}\|H_{\theta_c}(x_{t_1}^i) - H_{\theta_c}(x_{t_2}^j)\|^2}\right]$$

where $H_{\theta_c}(x)$ is a conservation term.

5. The method of claim 1, wherein a conservation term $H_{\theta_c}(x) \in \mathbb{R}^m$ is contrastively learned or given from prior knowledge, and a predicted trajectory is attempted to be enforced along a conservation manifold in a simulation stage such that $$\frac{dH_{\theta_c}(x)}{dt} = 0$$

and, denoting $G = \nabla_x H_{\theta_c}(x) \in \mathbb{R}^{n \times m}$, a projected dynamical model $\tilde{f}_{\theta_d}(x)$ is defined:

$$\tilde{f}_{\theta_d}(x) := \text{Projection}\left(f_{\theta_d}(x),\ \{f : G^\top f = 0\}\right) =$$
$$f_{\theta_d}(x) - G(G^\top G)^{-1}G^\top f_{\theta_d}(x) = f_{\theta_d}(x) - \Sigma_{i=1}^{m}(G_i^\perp)^\top f_{\theta_d}(x)G_i^\perp,$$

wherein a second equality is a standard orthogonal projection equation and a third equality is a Gram-Schmidt process, wherein $G^\perp$ denotes an orthonormalized matrix from G calculated by the Gram-Schmidt process, wherein $$G_i^\perp$$

is an $i^{th}$ component, and wherein the projected model dynamics naturally satisfies $(\nabla_x H_{\theta_c}(x))^T \tilde{f} = 0$ and guarantees that $H_{\theta_c}(x)$ is constant during prediction.

6. The method of claim 1, further comprising predicting performance of the physical system using the corresponding dynamic machine learning model.

7. The method of claim 6, further comprising:

responsive to the predicting of the performance indicating unsatisfactory performance, redesigning the physical system;

repeating the obtaining, applying, and employing steps for the redesigned physical system to obtain an updated dynamic machine learning model;

predicting performance of the redesigned physical system using the updated dynamic machine learning model; and responsive to the predicting of the performance of the redesigned indicating satisfactory performance, deploying and using the redesigned physical system.

8. A computer program product, comprising:

one or more tangible computer-readable storage media and program instructions stored on at least one of the one or more tangible computer-readable storage media, the program instructions executable by a processor, the program instructions comprising:

obtaining, using at least one hardware processor, data characterizing a physical system governed by a physical conservation law;

applying, using the at least one hardware processor, contrastive learning to the data to automatically capture system invariants of the physical system; and employing, using the at least one hardware processor, a neural projection layer to guarantee that a corresponding dynamic machine learning model preserves the captured system invariants, wherein a conservation term Hθc(x) is contrastively learned or given from prior knowledge, and wherein a predicted trajectory is constrained during a simulation stage to remain on a conservation manifold associated with the conservation term by applying an orthogonal projection operation that removes components of predicted dynamics parallel to a normal direction of the conservation manifold, such that projected model dynamics preserve the conservation term during prediction.

9. The computer program product of claim 8, the program instructions further comprising designing, using the at least one hardware processor, a square ratio loss function as a contrastive learning metric, wherein the captured system invariants are contrastively learned as a low-dimensional representation as an invariant quantity for the physical system and wherein the employing operation projects the corresponding dynamic model to an invariant manifold to ensure a conservation property.

10. The computer program product of claim 9, wherein the employing operation imposes conservation of an invariant function for dynamical system trajectory prediction, preserving a conservation quantity during dynamics modeling.

11. The computer program product of claim 9, wherein the square ratio loss function is defined as a contrastive loss function:

$$\mathcal{L}_{SR} = \frac{1}{NT}\Sigma_{i=1}^{N}\Sigma_{t_1=1}^{T}\left[\frac{\Sigma_{t_2=1}^{T}\|H_{\theta_c}(x_{t_1}^i) - H_{\theta_c}(x_{t_2}^i)\|^2}{\Sigma_{j=1}^{N}\Sigma_{t_2=1}^{T}\|H_{\theta_c}(x_{t_1}^i) - H_{\theta_c}(x_{t_2}^j)\|^2}\right]$$

where $H_{\theta_c}(x)$ is a conservation term.

12. The computer program product of claim 8, wherein a conservation term $H_{\theta_c}(x) \in \mathbb{R}^m$ is contrastively learned or given from prior knowledge, and a predicted trajectory is attempted to be enforced along a conservation manifold in a simulation stage such that $$\frac{dH_{\theta_c}(x)}{dt} = 0$$

and, denoting $G=\nabla_x H_{\theta_c}(x) \in \mathbb{R}^{n \times m}$, a projected dynamical model $\tilde{f}_{\theta_d}(x)$ is defined:

$$\tilde{f}_{\theta_d}(x) := \text{Projection}\left(f_{\theta_d}(x), \{f : G^\top f = 0\}\right) = f_{\theta_d}(x) - G(G^\top G)^{-1} G^\top f_{\theta_d}(x) = f_{\theta_d}(x) - \Sigma_{i=1}^{m} (G_i^\perp)^\top f_{\theta_d}(x) G_i^\perp,$$

wherein a second equality is a standard orthogonal projection equation and a third equality is a Gram-Schmidt process, wherein $G^\perp$ denotes an orthonormalized matrix from G calculated by the Gram-Schmidt process, wherein $$G_i^\perp$$

is an $i^{th}$ component, and wherein the projected model dynamics naturally satisfies $(\nabla_x H_{\theta_c}(x))^T \tilde{f}=0$ and guarantees that $H_{\theta_c}(x)$ is constant during prediction.

13. The computer program product of claim 8, the program instructions further comprising predicting performance of the physical system using the corresponding dynamic machine learning model.

14. A system comprising:

a memory; and at least one processor, coupled to said memory, and operative to perform operations comprising:

obtaining, using at least one hardware processor, data characterizing a physical system governed by a physical conservation law;

applying, using the at least one hardware processor, contrastive learning to the data to automatically capture system invariants of the physical system; and employing, using the at least one hardware processor, a neural projection layer to guarantee that a corresponding dynamic machine learning model preserves the captured system invariants, wherein a conservation term Hθc(x) is contrastively learned or given from prior knowledge, and wherein a predicted trajectory is constrained during a simulation stage to remain on a conservation manifold associated with the conservation term by applying an orthogonal projection operation that removes components of predicted dynamics parallel to a normal direction of the conservation manifold, such that projected model dynamics preserve the conservation term during prediction.

15. The system of claim 14, the operations performed by the processor further comprising designing, using the at least one hardware processor, a square ratio loss function as a contrastive learning metric, wherein the captured system invariants are contrastively learned as a low-dimensional representation as an invariant quantity for the physical system and wherein the employing operation projects the corresponding dynamic model to an invariant manifold to ensure a conservation property.

16. The system of claim 15, wherein the employing operation imposes conservation of an invariant function for dynamical system trajectory prediction, preserving a conservation quantity during dynamics modeling.

17. The system of claim 15, wherein the square ratio loss function is defined as a contrastive loss function:

$$\mathcal{L}_{SR} = \frac{1}{NT} \Sigma_{i=1}^{N} \Sigma_{t_1=1}^{T} \left[ \frac{\Sigma_{t_2=1}^{T} \left\| H_{\theta_c}(x_{t_1}^i) - H_{\theta_c}(x_{t_2}^i) \right\|^2}{\Sigma_{j=1}^{N} \Sigma_{t_2=1}^{T} \left\| H_{\theta_c}(x_{t_1}^i) - H_{\theta_c}(x_{t_2}^j) \right\|^2} \right]$$

where $H_{\theta_c}(x)$ is a conservation term.

18. The system of claim 14, wherein a conservation term $H_{\theta_c}(x) \in \mathbb{R}^m$ is contrastively learned or given from prior knowledge, and a predicted trajectory is attempted to be enforced along a conservation manifold in a simulation stage such that $$\frac{dH_{\theta_c}(x)}{dt} = 0$$

and, denoting $G=\nabla_x H_{\theta_c}(x) \in \mathbb{R}^{n \times m}$, a projected dynamical model $\tilde{f}_{\theta_d}(x)$ is defined:

$$\tilde{f}_{\theta_d}(x) := \text{Projection}\left(f_{\theta_d}(x), \{f : G^\top f = 0\}\right) = f_{\theta_d}(x) - G(G^\top G)^{-1} G^\top f_{\theta_d}(x) = f_{\theta_d}(x) - \Sigma_{i=1}^{m} (G_i^\perp)^\top f_{\theta_d}(x) G_i^\perp,$$

wherein a second equality is a standard orthogonal projection equation and a third equality is a Gram-Schmidt process, wherein $G^\perp$ denotes an orthonormalized matrix from G calculated by the Gram-Schmidt process, wherein $$G_i^\perp$$

is an $i^{th}$ component, and wherein the projected model dynamics naturally satisfies $(\nabla_x H_{\theta_c}(x))^T \tilde{f}=0$ and guarantees that $H_{\theta_c}(x)$ is constant during prediction.

19. The system of claim 14, the operations performed by the processor further comprising predicting performance of the physical system using the corresponding dynamic machine learning model.

20. The system of claim 19, the operations performed by the processor further comprising:

responsive to the predicting of the performance indicating unsatisfactory performance, obtaining human input characterizing a redesign of the physical system;

repeating the obtaining, applying, and employing steps for the redesigned physical system to obtain an updated dynamic machine learning model;

predicting performance of the redesigned physical system using the updated dynamic machine learning model; and responsive to the predicting of the performance of the redesigned indicating satisfactory performance, facilitating deploying and using the redesigned physical system.

* * * * *